(12) United States Patent
Do et al.

(10) Patent No.: US 7,952,273 B2
(45) Date of Patent: May 31, 2011

(54) ORGANIC LIGHT EMITTING DIODE DEVICE

(75) Inventors: Lee Mi Do, Daejeon (KR); Kyu Ha Baek, Daejeon (KR); Jeong Ik Lee, Gyeonggi-do (KR); Yong Suk Yang, Daejeon (KR); Sung Mook Chung, Gyeonggi-do (KR); Hye Yong Chu, Daejeon (KR); Sang Hee Park, Daejeon (KR); Chi Sun Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 109 days.

(21) Appl. No.: 11/951,149

(22) Filed: Dec. 5, 2007

(65) Prior Publication Data

US 2008/0136321 A1 Jun. 12, 2008

(30) Foreign Application Priority Data

Dec. 6, 2006 (KR) .................. 10-2006-0123091
Jun. 4, 2007 (KR) .................. 10-2007-0054496

(51) Int. Cl.
*H01J 1/62* (2006.01)
*H01J 63/04* (2006.01)

(52) U.S. Cl. ..................... 313/506; 313/509

(58) Field of Classification Search .......... 313/504, 313/506, 512, 509; 428/690; 438/29; 427/66
See application file for complete search history.

(56) References Cited

U.S. PATENT DOCUMENTS

| | | | |
|---|---|---|---|
| 5,677,572 A | 10/1997 | Hung et al. | |
| 5,719,467 A | 2/1998 | Antoniadis et al. | |
| 5,776,622 A | 7/1998 | Hung et al. | |
| 7,485,481 B2 * | 2/2009 | Kim et al. | 438/29 |
| 2001/0043044 A1 * | 11/2001 | Wakimoto et al. | 313/506 |
| 2003/0082406 A1 * | 5/2003 | Murase et al. | 428/690 |
| 2003/0190494 A1 * | 10/2003 | Lee, II | 428/690 |
| 2004/0051097 A1 * | 3/2004 | Ishikawa et al. | 257/40 |
| 2005/0008052 A1 * | 1/2005 | Nomura et al. | 372/39 |

(Continued)

FOREIGN PATENT DOCUMENTS

JP 01-243394 9/1989

(Continued)

OTHER PUBLICATIONS

C. Ganzorig et al, "Alkali metal acetates as effective electron injection layers for organic electroluminescent devices," Materials Science and Engineering, B85 (2001) 140-143.

*Primary Examiner* — Nimeshkumar D Patel
*Assistant Examiner* — Glenn Zimmerman
(74) *Attorney, Agent, or Firm* — Rabin & Berdo, P.C.

(57) ABSTRACT

An organic light emitting diode (OLED) device is provided. The OLED device includes: a substrate; an anode formed on the substrate; a first organic thin layer formed on the anode; an organic emission layer formed on the first organic thin layer; a second organic thin layer formed on the organic emission layer; and a cathode formed on the second organic thin layer, wherein the first and second organic thin layers are formed in a single layer or a multi-layer, and at least a part of the first or second organic thin layer is doped with or formed of an insulator. The OLED device provides excellent durability, long life-time, and increased luminous efficiency by balanced charge injection caused by doping or stacking the insulator into or on the organic thin layer.

6 Claims, 4 Drawing Sheets

U.S. PATENT DOCUMENTS

| | | | |
|---|---|---|---|
| 2005/0116633 A1* | 6/2005 | Yamazaki et al. | 313/506 |
| 2005/0233167 A1* | 10/2005 | Che et al. | 428/690 |
| 2005/0248272 A1* | 11/2005 | Koike et al. | 313/512 |
| 2006/0286405 A1* | 12/2006 | Begley et al. | 428/690 |
| 2007/0092753 A1* | 4/2007 | Begley et al. | 428/690 |
| 2007/0092754 A1* | 4/2007 | Begley et al. | 428/690 |
| 2007/0092755 A1* | 4/2007 | Begley et al. | 428/690 |
| 2007/0092756 A1* | 4/2007 | Begley et al. | 428/690 |
| 2007/0092759 A1* | 4/2007 | Begley et al. | 428/690 |
| 2007/0132370 A1* | 6/2007 | Boerner et al. | 313/504 |
| 2007/0187672 A1* | 8/2007 | Ono et al. | 257/40 |
| 2007/0207347 A1* | 9/2007 | Begley et al. | 428/690 |
| 2008/0032123 A1* | 2/2008 | Spindler et al. | 428/336 |
| 2008/0176099 A1* | 7/2008 | Hatwar et al. | 428/690 |

FOREIGN PATENT DOCUMENTS

| | | |
|---|---|---|
| JP | 06-163158 A | 6/1994 |
| JP | 10-308283 | 11/1998 |
| JP | 2003-303691 A | 10/2003 |
| JP | 2005-038849 A | 2/2005 |
| JP | 2005-190998 A | 7/2005 |
| JP | 2005-322464 A | 11/2005 |
| KR | 10-2001-0028643 | 4/2001 |
| KR | 10-2003-0025208 | 3/2003 |
| KR | 1020060135801 A | 12/2006 |
| WO | WO 2005043581 A2 * | 5/2005 |
| WO | WO 2005092984 A1 * | 10/2005 |
| WO | WO 2007/050302 A1 | 5/2007 |

* cited by examiner

FIG. 1
(PRIOR ART)

| | Cathode | ~90 |
|---|---|---|
| B { | EIL | ~80 |
| | ETL | ~70 |
| | HBL | ~60 |
| | EML | ~50 |
| A { | HTL | ~40 |
| | HIL | ~30 |
| | Anode | ~20 |
| | Substrate | ~10 |

FIG. 2

| | Cathode(Al) | ~90 |
|---|---|---|
| B { | EIL(LB) | ~80 |
| | ETL(Bphen) | ~70 |
| | EML(CBP-Ir(pp)3) | ~50 |
| A { | HTL(NPD) | ~40 |
| | Anode(ITO) | ~20 |
| | Substrate | ~10 |

FIG. 3

| Cathode(Al) | ~90 |
| EIL(LB) | ~80 |
| ETL(Bphen doped with LB) | ~71 |
| ETL(Bphen) | ~70 |
| EML(CBP-Ir(pp)3) | ~50 |
| HTL(NPD) | ~40 |
| Anode(ITO) | ~20 |
| Substrate | ~10 |

| Cathode(Al/Ag) | ~90 |
| EIL(LB) | ~80 |
| ETL(Bphen) | ~70 |
| EML(CBP-Ir(pp)3) | ~50 |
| HTL(NPD) | ~40 |
| HIL(m-TDATA) | ~30 |
| Anode(Ag) | ~20 |
| Substrate | ~10 |

B = {80, 70}
A = {40, 30}

ORGANIC LIGHT EMITTING DIODE DEVICE

CROSS-REFERENCE TO RELATED APPLICATION

This application claims priority to and the benefit of Korean Patent Application Nos. 2006-123091, filed Dec. 6, 2006, and 2007-54496, filed Jun. 4, 2007, the disclosures of which are incorporated herein by reference in their entirety.

BACKGROUND

1. Field of the Invention

The present invention relates to an organic light emitting diode (OLED) device, and more particularly, to an OLED device which has excellent durability, long life-time, and increases internal efficiency through balanced electron and hole injection by doping an insulator into or stacking an insulator on at least a part of an organic thin layer formed between an anode and an emission layer and between an emission layer and a cathode.

2. Discussion of Related Art

A conventional OLED device has a structure in which an emission layer is formed between an anode and a cathode, a first organic thin layer is formed between the anode and the emission layer, and a second organic thin layer is formed between the emission layer and the cathode. Here, when a voltage is applied from the outside, a hole is transported to the emission layer through the first organic thin layer from the anode, and an electron is transported to the emission layer through the second organic thin layer from the cathode, thereby generating an exciton in the emission layer and transferring the exciton from an excited state to a ground state to emit light.

FIG. 1 is a cross-sectional view of a conventional OLED device.

Referring to FIG. 1, an OLED device is formed by sequentially stacking an anode 20, a first organic thin layer A, an emission layer 50, a second organic thin layer B and a cathode 90 on a substrate 10.

The first organic thin layer A includes a hole injection layer 30 which has good hole injection properties, and a hole transport layer 40 which has good hole transport properties. And, the second organic thin layer B includes a hole blocking layer 60 which prevents hole pass, an electron injection layer 80 which has good electron injection properties, and an electron transport layer 70 which has good electron mobility properties. Theses layers are formed in the form of a thin film to facilitate injection of holes and electrons.

In such a conventional OLED device, the holes and electrons injected from both electrodes create excitons in the organic emission layer and then the excitons transition from an excited state to a ground state to emit light. However, it has problems of leakage current, non-uniform brightness and a short life-time of the device, which are caused by non-uniformity of charge due to a difference in mobility between the hole and the electron.

Accordingly, there is a continuous need for research and development on an OLED device that has high luminous efficiency, high durability and long life-time. Therefore, OLED devices are being improved in structure and material.

In the present invention, the inventors provide an OLED device having high internal efficiency, excellent durability and long life-time through balanced charge (hole or electron) injection by doping or stacking at least a part of a first organic thin layer between an anode and an emission layer or a second organic thin layer between an emission layer and a cathode constituting the OLED device using a predetermined insulator to have an appropriate concentration or thickness.

SUMMARY OF THE INVENTION

The present invention is directed to an organic light emitting diode (OLED) device which has improved luminous efficiency and life-time of the device.

One aspect of the present invention provides an OLED device including: a substrate; an anode formed on the substrate; a first organic thin layer formed on the anode; an organic emission layer formed on the first organic thin layer; a second organic thin layer formed on the organic emission layer; and a cathode formed on the second organic thin layer, wherein the first and second organic thin layers are formed in a single layer or a multi-layer, and at least a part of the first or second organic thin layer is doped with or formed of an insulator.

The OLED device according to the present invention includes a substrate, an anode, a first organic thin layer, an emission layer, a second organic thin layer and a cathode. Here, the first organic thin layer may be a hole injection layer or a hole transport layer, and the second organic thin layer may be a hole blocking layer, an electron transport layer or an electron injection layer. While all of the hole injection layer, the hole transport layer, the hole blocking layer, the electron transport layer and the electron injection layer may be included in the OLED device, each layer may be omitted.

Accordingly, at least one of the hole injection layer, the hole transport layer, the hole blocking layer, the electron transport layer and the electron injection layer may be doped with or formed of an insulator. Also, another insulator layer may be formed at a predetermined position on the first or second organic thin layer, for example, on the hole injection layer, on the hole transport layer, between the hole injection layer and the hole transport layer, on the hole blocking layer, on the electron transport layer, on the electron injection layer, between the hole blocking layer and the electron transport layer, or between the electron transport layer and the electron injection layer.

The insulator may serve as a barrier against transfer of holes and electrons to the emission layer from the anode and the cathode, and thus control flow of charges, and minimize an energy barrier between an organic thin layer and an electrode, thereby easily injecting the charges. Thus, driving voltage may be lower and interface characteristics between the electrode and the organic thin layer or between the organic thin layers may be improved.

Such an insulator may include inorganic and/or organic insulators including a non-conductive material having strong dipole characteristics.

The non-conductive material may include at least one selected from the group consisting of metal or nonmetal oxides including alkali oxide, alkaline earth metal oxide, metal or non-metal oxide, alkali fluoride, alkaline earth metal fluoride and anions.

The alkali oxide may include at least one selected from the group consisting of lithium oxide, sodium oxide, potassium oxide, rubidium oxide and cesium oxide.

The alkaline earth metal oxide may include at least one selected from the group consisting of magnesium oxide, calcium oxide, strontium oxide and barium oxide.

The alkali fluoride may include at least one selected from the group consisting of lithium fluoride, sodium fluoride, potassium fluoride, rubidium fluoride and cesium fluoride.

The alkaline earth metal fluoride may include at least one selected from the group consisting of magnesium fluoride, calcium fluoride, strontium fluoride and barium fluoride.

The metal or nonmetal oxide may include at least one selected from the group consisting of aluminum oxide, silicon oxide, titanium oxide and tantalum oxide.

In the metal or nonmetal compound having anions, the anion may include acetate, benzoate or carbonate, and the metal may include an alkali metal such as lithium, sodium, potassium, rubidium or cesium. Particularly, the metal or nonmetal compound may include lithium acetate, sodium acetate, potassium acetate, rubidium acetate, cesium acetate, lithium benzoate, sodium benzoate, potassium benzoate, rubidium benzoate, cesium benzoate, lithium carbonate, sodium carbonate, potassium carbonate, rubidium carbonate or cesium carbonate.

The insulator may be stacked to a thickness of 0.1 to 10 nm, or doped at a concentration of 1 to 50 wt %.

The transfer of the hole and electron to the emission layer from the anode and cathode may be controlled by selection of the material forming the insulator, control of appropriate thickness and appropriate doping concentration, and thus recombination probability of the hole and the electron in the emission layer may be increased, and luminous efficiency may also be increased due to the balanced charge injection.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 1 is a cross-sectional view of a conventional OLED device;

FIGS. 2 to 4 are cross-sectional views of OLED devices according to exemplary embodiments of the present invention;

DETAILED DESCRIPTION OF EXEMPLARY EMBODIMENTS

Figure 5:
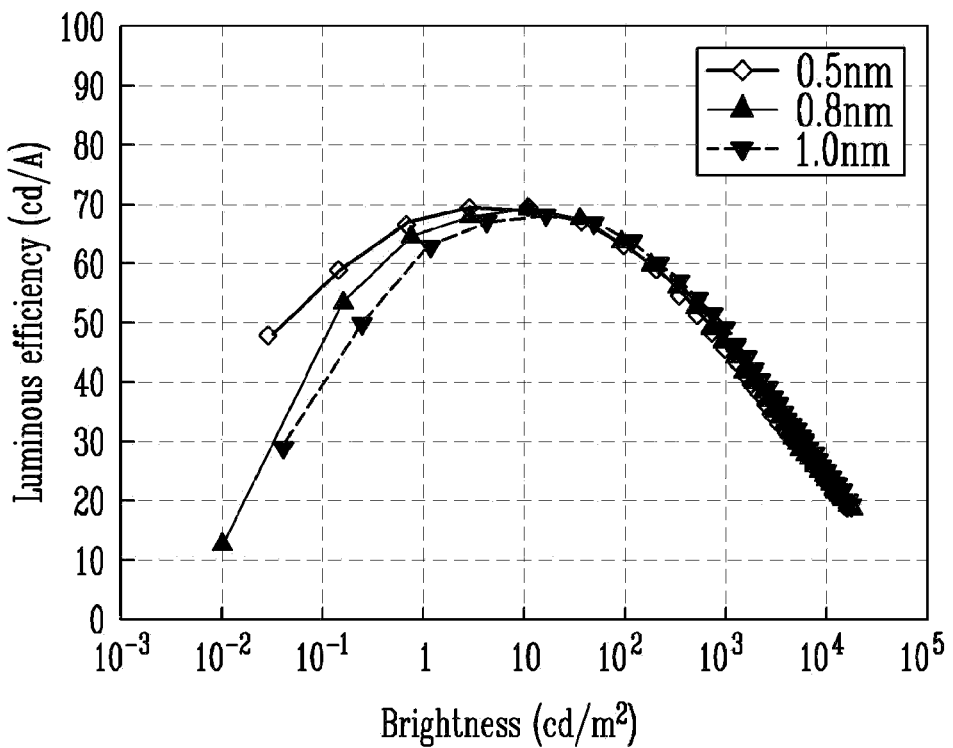
FIG. 5 is a graph illustrating luminous efficiency depending on the thickness of an insulating layer in an OLED device according to the present invention.

Hereinafter, the present invention will be described in detail with reference to drawings illustrating exemplary embodiments of the present invention.

FIGS. 2 to 4 illustrate stacked structures of an organic light emitting diode (OLED) device according to the present invention.

Referring to FIG. 2, the OLED device may have a stacked structure of a substrate 10, an anode 20, a hole transport layer 40, an emission layer 50, an electron transport layer 70, an electron injection layer 80 formed of an insulator, and a cathode 90. Referring to FIG. 3, the OLED device may have a stacked structure of a substrate 10, an anode 20, a hole transport layer 40, an emission layer 50, an electron transport layer 70, an electron transport layer 71 doped with an insulator, an electron injection layer 80 formed of an insulator, and a cathode 90. And, referring to FIG. 4, the OLED device may have a stacked structure of a substrate 10, an anode 20, a hole injection layer 30, a hole transport layer 40, an emission layer 50, an electron transport layer 70, an electron injection layer 80 formed of an insulator, and a cathode 90. In addition, other stacked structures may be possible.

The structure and layers of the OLED device will now be described in detail with reference to FIG. 4.

The substrate 10 may be formed of any material commonly used in this field, for example, glass, plastic, a polymer film or stainless steel (SUS).

The anode 20 serves to inject a hole into the emission layer 50 through a first organic thin layer, and may be a transparent or reflective electrode. When the anode 20 is a transparent electrode, it may be formed of an indium tin oxide (ITO) layer, an indium zinc oxide (IZO) layer, a tin oxide (TO) layer, or a zinc oxide (ZnO) layer. When the anode 20 is a reflective electrode, it may have a structure in which a transparent oxide layer of ITO, IZO, TO or ZnO is formed on an Ag, Al, Ni, Pt or Pd layer or an alloy thereof.

The anode 20 may be formed to a thickness generally used in this field on the substrate 10 using a vapor phase deposition method such as sputtering or evaporation, an ion beam deposition method, an electron beam deposition method or a laser ablation method.

Although the first organic thin layer A according to the present invention has the structure in which the hole injection layer 30 and the hole transport layer 40 are sequentially stacked, the present invention is not limited thereto, and thus the first organic thin layer A may be formed of only one of the hole injection layer 30 and the hole transport layer 40, or may include multiple layers thereof.

The hole injection layer 30 and/or the hold transport layer 40 formed on the anode 20 serve to easily inject and transport holes to the emission layer 50, which may be formed of the following materials: for example, a low molecular material such as 4,4',4"-tris[N-(1-naphthyl)-N-phenylamino]triphenyl amine (TNATA), 4,4',4"-tris(N-carbazolyl)triphenyl amine (TCTA), 1,3,5-tris(4-(2,2-dipyridylamino)phenyl) benzene (TDAPB) or 4,4',4"-tris(N,N-diphenylamino)triphenyl amine (TDATA), or a high molecular material such as polyaniline (PANI) or poly(3,4-ethylenedioxythiophene) (PEDOT). Also, a buffer layer of a metal complex such as copper phthalocyanine (CuPc) may be interposed in order to enhance contact between interfaces, thereby extending a device's life-time.

Further, according to the present invention, the hole injection layer 30 or the hole transport layer 40 may be doped with the insulator described above in a range of 1 to 50 wt %, or may be stacked to a thickness of 0.1 nm to 10 nm.

The hole injection layer 30 and the hole transport layer 40 may be formed to a thickness generally used in this field using any one selected from the group consisting of a vapor phase deposition method, a spin coating method and an ink-jet method.

The organic emission layer 50 may be a phosphorescent or fluorescent emission layer. The fluorescent emission layer 50 may include one material selected from the group consisting of 8-trishydroxyquinoline aluminum (Alq3), distyrylarylene (DSA), a DSA derivative, distyrylbenzene (DSB), a DSB derivative, (4,4'-bis(2,2'-diphenyl vinyl)-1,1'-biphenyl) (DPVBi), a DPVBi derivative, a spiro-DPVBi and a spiro-sexyphenyl (spiro-6P) depending on an emitting color. Furthermore, the emission layer 50 may include one dopant material selected from the group consisting of styrylamine, perylene and distyrylbiphenyl (DSBP)-based materials.

On the other hand, the phosphorescent emission layer 50 may include one material selected from the group consisting of arylamine, cabazole and spiro-based materials as a host material. Preferably, the host material is one selected from the group consisting of 4,4-N,N-dicarbazole-biphenyl (CBP), a CBP derivative, N,N-dicarbazolyl-3,5-benzene (mCP), an mCP derivative and a spiro-based derivative. The dopant material may include a phosphorescent organic metal complex having one core metal selected from the group consisting of Ir, Pt, Tb and Eu. The phosphorescent organic metal complex may be one selected from the group consisting of PQIr, PQIr(acac), PQ2Ir(acac), PIQIr(acac) and PtOEP.

In a full color OLED device, the emission layer 50 may be formed by a vacuum deposition method using a fine metal mask, an ink-jet printing method or a laser induced thermal imaging method. The emission layer may be formed to a general thickness used in this field.

A second organic thin layer B is formed on the emission layer 50. The second organic thin layer B may include a hole blocking layer, an electron transport layer 70 and an electron injection layer 80, which are sequentially stacked, and each layer may possibly be omitted.

The hole blocking layer may be selectively formed, and thus omitted on the fluorescent emission layer 50, and serves to prevent diffusion of excitons generated in the emission layer 50 during driving of the device. Such a hole blocking layer may be formed to a thickness generally used in this field using BAlq, BCP, CF-X, TAZ or spiro-TAZ.

The electron transport layer 70 may be formed on the emission layer 50 or the hole blocking layer 60. The electron transport layer 70 serves to easily transport an electron to the emission layer 50, and may be formed of a high molecular material such as PBD, TAZ, spiro-PBD, or a low molecular material such as 4,7-diphenyl-1,10-phenantroline (Bphen), Alq3, BAlq or SAlq.

The electron injection layer 80 may be formed on the electron transport layer 70. The electron injection layer 80 serves to easily inject an electron into the emission layer 50, and may be formed of Alq3, LiF, Ga complex or PBD. Meanwhile, the electron transport layer 70 and the electron injection layer 80 may be formed to a general thickness by a vacuum deposition method, a spin coating method, an ink-jet printing method or a laser induced thermal imaging method.

In the meantime, according to the present invention, at least a part of the hole blocking layer 60, the electron transport layer 70 or the electron injection layer 80 may be doped with the insulator material described above at 1 to 50 wt %, or stacked to a thickness of 0.1 to 10 nm using the insulator material. FIGS. 2 and 4 illustrate the electron injection layer 80 stacked using an insulator, and FIG. 3 illustrates the electron transport layer 70 doped with an insulator and the electron injection layer 80 stacked using an insulator.

The cathode 90 used as an electron injection electrode injects an electron into the emission layer 50, and commonly employs a metal having a low work function (4.2 eV or less) such as Ca, Ag, Mg—Ag, Ca/Al, Al, etc. or an alloy such as Al—Li, Al—Mg, etc. Meanwhile, the transparent cathode may be formed of one selected from the group consisting of Ag, Ca, Ca/Ag and Mg/Ag.

In the OLED device having such a structure, when at least a part of the first or second organic thin layer A or B is doped or formed to have an appropriate concentration or thickness using a properly selected insulator material, a device may have improved internal efficiency by balanced electron and hole injection, excellent durability and long life-time.

Although the present invention will now be described in more detail with reference to exemplary embodiments, it is not limited thereto.

Embodiment 1

First, a cathode 20, an ITO electrode, was formed to a thickness of 100 nm on a substrate 10, and then a hole transport layer 40 was formed to a thickness of 50 nm using NPD (a first step). On the hole transport layer 40, a green phosphorescent emission layer 50 was formed to a thickness of 10 nm by doping 8 wt % Ir(ppy)3 into CBP (a second step). Then, an electron transport layer 70 as a second organic thin layer was formed to a thickness of 50 nm on the emission layer 50 using Bphen (a third step). An electron injection layer 80 was formed by stacking an organic insulator, i.e., lithium benzoate (LB), to thicknesses of 0.5, 0.8 and 1.0 nm on the electron transport layer 70, respectively (a fourth step). Finally, a cathode 90 was formed by depositing Al to 60 nm, and thus an OLED device was completed.

Luminous efficiency depending on an LB thickness in the OLED device manufactured by Embodiment 1 was estimated, and the result is shown in FIG. 5.

It can be noted from FIG. 5 that the luminous efficiency is increased by approximately 10% at 1000 cd/m$^2$ as the thickness of the organic insulator is increased.

Embodiment 2

First, an anode 20, an ITO electrode, was formed to a thickness of 100 nm on a substrate 10, and then a hole transport layer 40 of a first organic thin layer was formed to a thickness of 50 nm using NPD (a first step). On the hole transport layer 40, a green phosphorescent emission layer 50 was formed to a thickness of 10 nm by doping 8 wt % Ir(ppy)3 into CBP (a second step). An electron transport layer 70 as a second organic thin layer was formed to a thickness of 10 nm on the emission layer 50 using Bphen. Then, the electron transport layer 70 was doped with organic insulators, LB, at concentrations of 0, 10 and 50 wt %, respectively, thereby forming a 40 nm Bphen thin film 71 (a third step). An electron injection layer 80 was formed by forming an organic insulator, LB, to a thickness of 1 nm on the electrode transport layer 71 doped with the organic insulator (a fourth step). And, a cathode 90 was formed by depositing Al to 60 nm, and thus an OLED device was completed.

Figure 6:
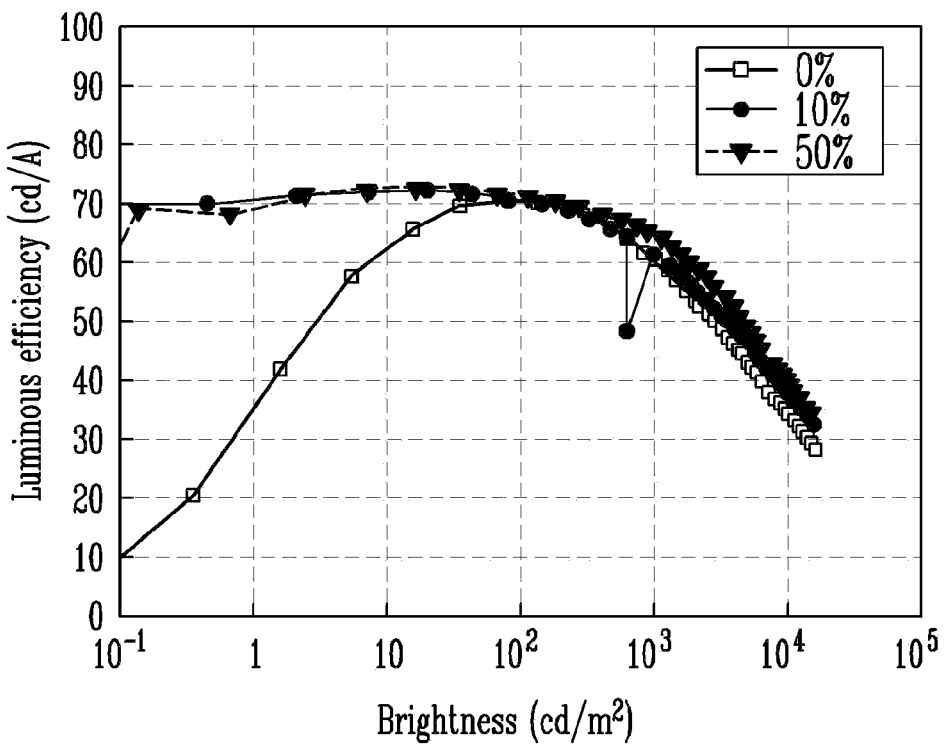
FIG. 6 is a graph illustrating luminous efficiency depending on a doping concentration of an insulator in an OLED device according to the present invention.

Luminous efficiency depending on an LB doping concentration was estimated according to Embodiment 2, and the result is shown in FIG. 6.

It can be noted from FIG. 6 that the luminous efficiency is drastically increased as the electron transport layer 70 is doped with an insulator and the electron injection layer 80 is formed of LB thereon at a low brightness of 100 cd/m$^2$ or less, and the luminous efficiency at 10000 cd/m$^2$ is increased by approximately 20%, from 34 cd/A to 41 cd/A, as the doping concentration is higher.

Embodiment 3

First, an Ag anode 20 having excellent reflectivity was formed to a thickness of 80 nm by vacuum deposition (a first step). A first organic thin layer was formed on the anode in a multi-layer structure of a hole injection layer 30 and a hole transport layer 40, the hole injection layer 30 being formed of m-TDATA to have a thickness of 20 nm and the hole transport layer 40 being formed of NPD to have a thickness of 30 nm (a second step). A green phosphorescent emission layer 50 was formed to a thickness of 10 nm by doping 8 wt % Ir(ppy)3 into CBP on the hole transport layer 40 (a third step). An electron transport layer 70 as a second organic thin layer was formed to a thickness of 50 nm using Bphen on the emission layer 50, and electron injection layer 80 was formed by stacking an organic insulator, LB, to 0, 5, 10 and 15 nm, respectively (a fourth step). Then, a transparent cathode was formed to thicknesses of 1 and 15 nm using Al and Ag on the electron injection layer 80, respectively, and thus a top-emission OLED device was completed.

Figure 7:
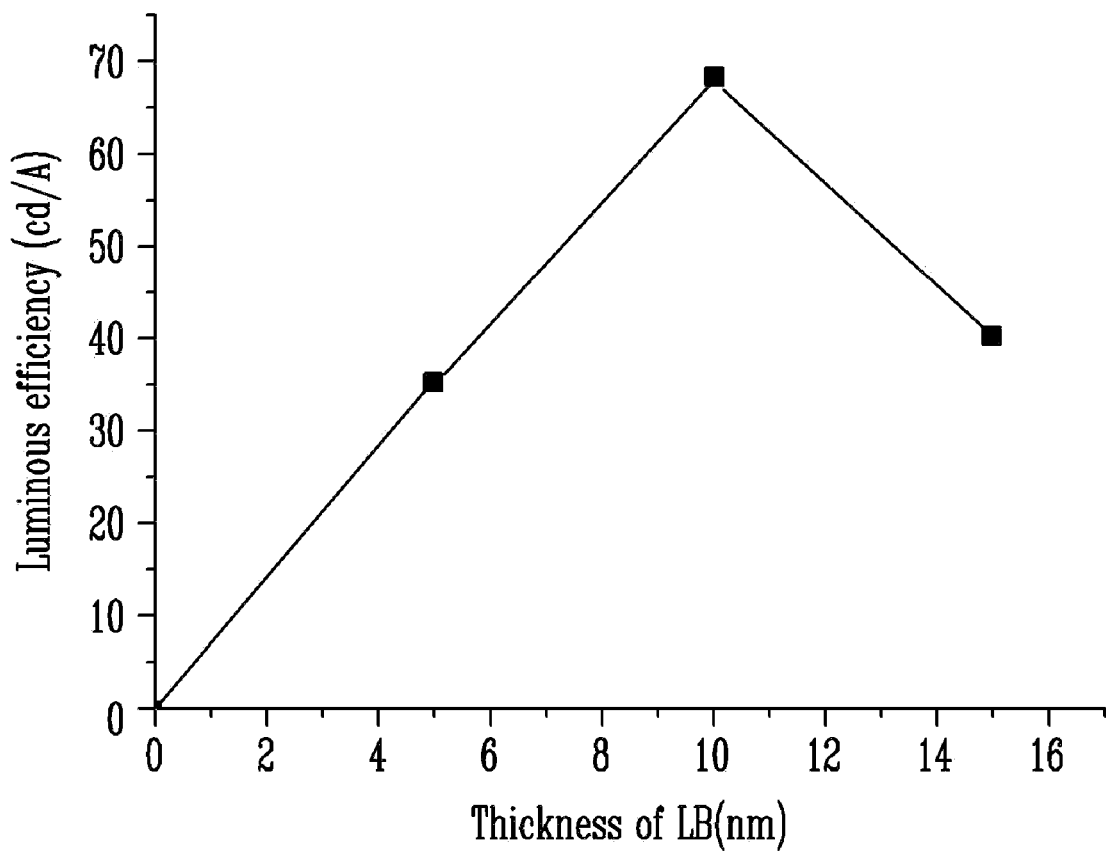
FIG. 7 is a graph illustrating luminous efficiency depending on the thickness of an insulating layer in a top-emission OLED device according to the present invention.

Luminous efficiency depending on the thickness of the electron injection layer formed of the organic insulator according to Embodiment 3 was estimated, and the result is shown in FIG. 7.

It can be noted from FIG. 7 that the luminous efficiency is significantly increased when the electron injection layer 80 is formed of LB, and while the luminous efficiency is increased more than 2 times as the thickness of LB is increased to 10 nm, it is decreased as the thickness of LB is more than 10 nm.

This is because the electron is easily injected by a tunneling phenomenon when the organic insulating layer used as the electron injection layer 80 is thin, but the charge is difficult to be injected due to a thick barrier of the insulator when the organic insulating layer is more than 10 nm.

An OLED device according to the present invention has the following effects.

First, hole mobility is generally 100 times greater than electron mobility in an OLED device. The difference in mobility between charges causes unbalanced charge injection, thereby increasing leakage current and decreasing luminous efficiency. Accordingly, the OLED device serves as a barrier against a hole and an electron which are respectively transferred from positive and negative electrodes to an emission layer in order to control charge flow, thereby minimizing the leakage current and extending a device's life-time.

Second, hole and electron transfer may be controlled by appropriate selection of an insulating layer for first and second organic thin layers, control of appropriate thickness and appropriate doping concentration, and thus recombination probability of the hole and electron in the emission layer is increased, thereby increasing the luminous efficiency due to the balanced charge injection.

Third, when the first and second organic thin layers are doped with or formed of an insulator, the thin films are in better contact with each other at their interfaces between the anode and the emission layer or between the cathode and the emission layer, thereby forming an organic thin layer having excellent thermal stability, and thus a highly durable device may be completed.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An organic light emitting diode (OLED) device, comprising:
   a substrate;
   an anode formed on the substrate;
   a first organic thin layer formed on the anode;
   an organic emission layer formed on the first organic thin layer;
   a second organic thin layer formed on the organic emission layer; and
   a cathode formed on the second organic thin layer,
   wherein:
   the first and second organic thin layers are formed in a single layer or a multi-layer, and at least a part of at least one of the first and second organic thin layers is doped with or formed of Lithium Benzoate;
   the first organic thin layer includes a hole injection layer, or a hole injection layer and a hole transport layer;
   the second organic thin layer includes a hole blocking layer and at least one selected from the group consisting of an electron injection layer and an electron transport layer; and
   the hole blocking layer includes at least one selected from the group consisting of BAlq, BCP, CF-X, TAZ and spiro-TAZ, and is doped with Lithium Benzoate.

2. The OLED device according to claim 1, wherein the at least a part of at least one of the first and second organic thin layers formed of Lithium Benzoate is formed to a thickness ranging from 0.1 to 10 nm.

3. The OLED device according to claim 1, wherein the doping concentration of Lithium Benzoate in the hole blocking layer is 1 to 50 wt %.

4. The OLED device according to claim 1, wherein the electron transport layer is doped with Lithium Benzoate.

5. The OLED device according to claim 1, wherein the second organic thin layer comprises a hole blocking layer formed on the organic emission layer, an electron transport layer formed on the hole blocking layer, and an electron injection layer formed on the electron transport layer.

6. The OLED device according to claim 1, wherein the second organic thin layer comprises an electron transport layer formed on the organic emission layer, and an electron injection layer formed on the electron transport layer, and
   wherein the electron transport layer is doped with Lithium Benzoate.

* * * * *